United States Patent
Xu

(10) Patent No.: US 9,960,378 B2
(45) Date of Patent: May 1, 2018

(54) QUANTUM DOT LIGHT EMITTING DEVICE AND MANUFACTURING METHOD THEREOF, LIQUID CRYSTAL DISPLAY DEVICE

(71) Applicant: Shenzhen China Star Optoelectronics Technology Co., Ltd., Shenzhen, Guangdong (CN)

(72) Inventor: Chao Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 156 days.

(21) Appl. No.: 15/039,427

(22) PCT Filed: May 11, 2016

(86) PCT No.: PCT/CN2016/081679
§ 371 (c)(1),
(2) Date: May 26, 2016

(87) PCT Pub. No.: WO2017/128551
PCT Pub. Date: Aug. 3, 2017

(65) Prior Publication Data
US 2018/0062100 A1 Mar. 1, 2018

(30) Foreign Application Priority Data
Jan. 25, 2016 (CN) .......................... 2016 1 0050077

(51) Int. Cl.
*H01L 51/50* (2006.01)
*H01L 51/52* (2006.01)
(Continued)

(52) U.S. Cl.
CPC ...... *H01L 51/502* (2013.01); *G02F 1/133603* (2013.01); *H01L 27/3232* (2013.01);
(Continued)

(58) Field of Classification Search
CPC ............. H01L 51/0545; H01L 51/0036; H01L 51/0541; H01L 51/5012; H01L 51/502; H01L 33/32; H01L 33/06; H01L 33/0073
See application file for complete search history.

(56) References Cited

U.S. PATENT DOCUMENTS 9,634,277 B2 * 4/2017 Zou ...................... H01L 51/502
2013/0153881 A1 6/2013 Tokoo
2015/0287927 A1 10/2015 Okubo et al.

FOREIGN PATENT DOCUMENTS

CN 102263205 A 11/2011
CN 103427030 A 12/2013
(Continued)

OTHER PUBLICATIONS

Du bin etc. Research Progress of Ammonium-Functionalized Conjugated Polyele Ctrolytes and Their Precursors Used in Electron Injection Layer of PLED. China Printing and Packaging Study vol. 05 No. 1. Feb. 28, 2013.

*Primary Examiner* — Quoc Hoang
(74) *Attorney, Agent, or Firm* — Andrew C. Cheng

(57) ABSTRACT

The invention provides a quantum dot light emitting device and a manufacturing method thereof and further a liquid crystal display device. The quantum dot light emitting device includes an anode and a cathode disposed opposite to and spaced from each other, and further a hole injection layer, a first hole transport layer, a first quantum dot light emitting layer, a charge generation layer, a second quantum dot light emitting layer, a first electron transport layer and an electron injection layer sequentially stacked between the anode and the cathode in that order. The charge generation layer includes sequentially-disposed a second electron transport layer, a carrier generation layer and a second hole transport layer in that order. The first quantum dot light emitting layer emits a first light, the second quantum dot light emitting layer emits a second light, and the second electron transport layer includes a water/alcohol-soluble polymer.

17 Claims, 3 Drawing Sheets

(51) Int. Cl.
H01L 51/00 (2006.01)
H01L 51/56 (2006.01)
H01L 27/32 (2006.01)
G02F 1/1335 (2006.01)

(52) U.S. Cl.
CPC ...... *H01L 51/0003* (2013.01); *H01L 51/0039* (2013.01); *H01L 51/504* (2013.01); *H01L 51/506* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5278* (2013.01); *H01L 51/56* (2013.01); *G02F 2201/44* (2013.01); *H01L 2251/301* (2013.01); *H01L 2251/305* (2013.01); *H01L 2251/308* (2013.01); *H01L 2251/558* (2013.01)

(56) References Cited

FOREIGN PATENT DOCUMENTS

| | | | |
|---|---|---|---|
| CN | 103664748 A | 3/2014 | |
| CN | 104051641 A | 9/2014 | |
| CN | 104362255 A | 2/2015 | |
| CN | 105185916 A | 12/2015 | |

\* cited by examiner

QUANTUM DOT LIGHT EMITTING DEVICE AND MANUFACTURING METHOD THEREOF, LIQUID CRYSTAL DISPLAY DEVICE

CROSS REFERENCE TO RELATED APPLICATION

This application claims the priority of Chinese Patent Application No. 201610050077.9, entitled "Quantum Dot Light Emitting Device and Manufacturing Method Thereof, Liquid Crystal Display Device", filed on Jan. 25, 2016, the disclosure of which is incorporated herein by reference in its entirety.

BACKGROUND OF THE INVENTION

1. Field of the Invention

The invention relates to the field of display technology, and particularly to a quantum dot light emitting device and a manufacturing method thereof, and further relates to a liquid crystal display device.

2. Description of Related Art

A quantum dot light emitting device such as a quantum dot light emitting diode (QLED) is known as a new generation of lighting devices after the organic light emitting device owing to its advantages of wide color gamut, high color purity, good stability, low power consumption, low cost and so on. The quantum dot light emitting device includes a quantum dot light emitting layer. The quantum dot light emitting layer generally is formed by the following method that: a quantum dot light emitting material is dissolved into an organic solvent, and then a film is formed by spin coating as the quantum dot light emitting layer. Because the other films covered on the quantum dot light emitting layer during being formed are easy to cause the damage to the already-formed quantum dot light emitting layer, so that it is difficult to produce a quantum dot light emitting device including multiple (i.e., more than one) quantum dot light emitting layers at the same time.

SUMMARY OF THE INVENTION

The invention provides a quantum dot light emitting device. The quantum dot light emitting device includes: an anode, a hole injection layer, a first hole transport layer, a first quantum dot light emitting layer, a charge generation layer, a second quantum dot light emitting layer, a first electron transport layer, an electron injection layer and a cathode. The anode and the cathode are disposed opposite to and spaced from each other. The hole injection layer, the first hole transport layer, the first quantum dot light emitting layer, the charge generation layer, the second quantum dot light emitting layer, the first electron transport layer and the electron injection layer are sequentially stacked between the anode and the cathode in that order. The hole injection layer is in contact with the anode, and the electron injection layer is in contact with the cathode. The charge generation layer includes a second electron transport layer, a carrier generation layer and a second hole transport layer. The second electron transport layer, the carrier generation layer and the second hole transport layer are stacked sequentially, the second electron transport layer is disposed on a surface of the first quantum dot light emitting layer away from the first hole transport layer; the second hole transport layer is disposed on a surface of the second quantum dot light emitting layer away from the first electron transport layer. The anode is configured (i.e., structured and arranged) for providing a first hole, the cathode is configured for providing a first electron, the hole injection layer is configured for injecting the first hole into the first hole transport layer, the first hole transport layer is configured for transporting the first hole to the first quantum dot light emitting layer, the electron injection layer is configured for injecting the first electron into the first electron transport layer, the first electron transport layer is configured for transporting the first electron to the second quantum dot light emitting layer, the carrier generation layer is configured for generating a second electron and second hole, the second electron transport layer is configured for transporting the second electron to the first quantum dot light emitting layer, the second hole transport layer is configured for transporting the second hole to the second quantum dot light emitting layer, the second electron and the first hole are configured to be recombined in the first quantum dot light emitting layer to emit a first light, the second hole and the first electron are configured to be recombined in the second quantum dot light emitting layer to emit a second light, and the second electron transport layer includes a water/alcohol-soluble polymer.

In an embodiment, the water/alcohol-soluble polymer includes any one or more than one of Polyfluorene (PFN), Bromine Polyfluorene (PFNBr) and Sulfo-Polyfluorene (PFNSO).

In an embodiment, the carrier generation layer is a metal layer.

In an embodiment, the second hole transport layer includes a P-type metal oxide, and the P-type metal oxide includes any one or more than one of $MoO_3$, $NiO$, $V_2O_5$ and $WoO_3$.

In an embodiment, a color of the first light is the same as that of the second light, or the color of the first light is different from that of the second light.

In an embodiment, the anode includes indium tin oxide, and the cathode includes aluminum.

In an embodiment, the first quantum dot light emitting layer includes a single layer or multiple layers of quantum dots, or/and the second quantum dot light emitting layer includes a single layer or multiple layers of quantum dots.

In an embodiment, a thickness of the second electron transport layer is 10~20 nm, a thickness of the carrier generation layer is 5 nm, and a thickness of the second hole transport layer is 10 nm.

The invention further provides a manufacturing method of a quantum dot light emitting device. The manufacturing method of a quantum dot light emitting device includes:

providing a substrate;

forming an anode on a surface of the substrate;

coating a hole injection material on a surface of the anode away from the substrate to form a hole injection layer;

coating a first hole transport material on a surface of the hole injection layer away from the anode to form a first hole transport layer;

coating a first quantum dot light emitting material on a surface of the first hole transport layer away from the hole injection layer to form a first quantum dot light emitting layer;

forming a charge generation layer on a surface of the first quantum dot light emitting layer away from the first hole transport layer, wherein the charge generation layer includes a second electron transport layer, a carrier generation layer and a second hole transport layer; the second electron transport layer, the carrier generation layer and the second hole transport layer are stacked sequentially, and the second electron transport layer is disposed on the surface of the first quantum dot light emitting layer away from the first hole transport layer;

coating a second quantum dot light emitting material on a surface of the charge generation layer away from the first quantum dot light emitting layer to form a second quantum dot light emitting layer;

coating a first electron transport material on a surface of the second quantum dot light emitting layer away from the charge generation layer to form a first electron transport layer;

coating an electron injection material on a surface of the first electron transport layer away from the second quantum dot light emitting layer to form an electron injection layer; and forming a cathode on a surface of the electron injection layer away from the first electron transport layer.

The invention still further provides a liquid crystal display device. The liquid crystal display device includes a quantum dot light emitting device according to any one of the preceding embodiments.

Compared with the prior art, the quantum dot light emitting device of the invention includes the charge generation layer, and the charge generation layer connects the first quantum dot light emitting layer with the second quantum dot light emitting layer in tandem; the charge generation layer includes the second electron transport layer, the carrier generation layer and the second hole transport layer, and the second electron transport layer includes the water/alcohol-soluble polymer. The water/alcohol-soluble polymer can be dissolved in a highly polar solvent such as water, methanal and so on. The damage applied onto the first quantum dot light emitting layer during the second electron transport layer is formed as a film can be avoided, and therefore the performance of the quantum dot light emitting device can be improved. Furthermore, the water/alcohol-soluble polymer is non-toxic and thus has no pollution to the environment and is green environmental protection during the production process.

BRIEF DESCRIPTION OF THE DRAWINGS

In order to more clearly illustrate technical solutions of embodiments of the invention or the prior art, drawings will be used in the description of the embodiments of the invention or the prior art will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
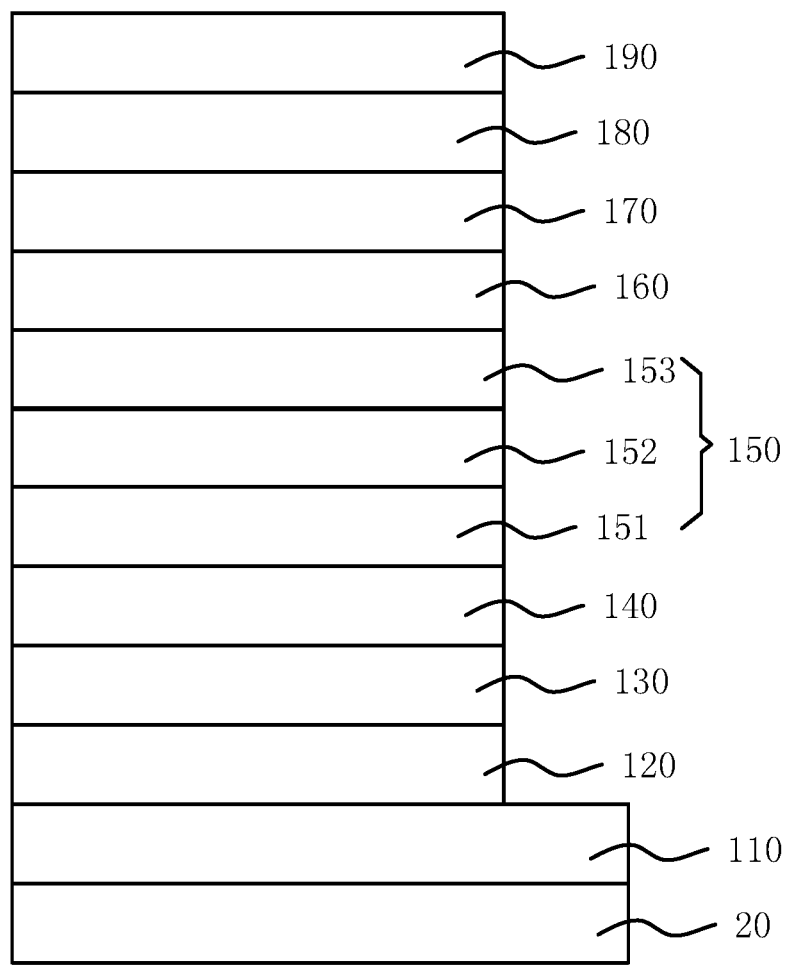
FIG. 1 is a structural schematic view of a quantum dot light emitting device according to a preferred embodiment of the invention.

Please refer to FIG. 1, FIG. 1 is structural schematic view of a quantum dot light emitting device according to a preferred embodiment of the invention. The quantum dot light emitting device 100 includes an anode 110, a hole injection layer 120, a first hole transport layer 130, a first quantum dot light emitting layer 140, a charge generation layer 150, a second quantum dot light emitting layer 160, a first electron transport layer 170, an electron injection layer 180 and a cathode layer 190. The anode 110 and the cathode 190 are disposed opposite to and spaced from each other. The hole injection layer 120, the first hole transport layer 130, the first quantum dot light emitting layer 140, the charge generation layer 150, the second quantum dot light emitting layer 160, the first electron transport layer 170 and the electron injection layer 180 are sequentially stacked between the anode 110 and the cathode 190 in that order, the hole injection layer 120 is in contact with the anode 110, and the electron injection layer 180 is in contact with the cathode 190. The charge generation layer 150 includes a second electron transport layer 151, a carrier generation layer 152 and a second hole transport layer 153. The second electron transport layer 151, the carrier generation layer 152 and the second hole transport layer 153 are sequentially stacked in that order. The second electron transport layer 151 is disposed on a surface of the first quantum dot light emitting layer 140 away from the first hole transport layer 130. The second hole transport layer 153 is disposed on a surface of the second quantum dot light emitting layer 160 away from the first electron transport layer 170. The anode 110 is configured (i.e., structured and arranged) for providing a first hole, the cathode 190 is configured for providing a first electron, the hole injection layer 120 is configured for injecting the first hole into the first hole transport layer 130, the first hole transport layer 130 is configured for transporting the first hole to the first quantum dot light emitting layer 140, the electron injection layer 180 is configured for injecting the first electron into the first transport layer 170, the first electron transport layer 170 is configured for transporting the first electron to the second quantum dot light emitting layer 160, the carrier generation layer 152 is configured for generating a second electron and a second hole, the second electron transport layer 151 is configured for transporting the second electron to the first quantum dot light emitting layer 140, the second hole transport layer 153 is configured for transporting the second hole to the second quantum dot light emitting layer 160, the second electron and the first hole are recombined in the first quantum dot light emitting layer 140 to emit a first light, the second hole and the first electron are recombined in the second quantum dot light emitting layer 160 to emit a second light. The second electron transport layer 151 includes a water/alcohol-soluble polymer.

In an embodiment, the color of the first light is the same as the color of second light. In another embodiment, the color of the first light is different from the color of the second light.

The water/alcohol-soluble polymer includes any one or more than one of Polyfluorene (PFN), Bromine Polyfluorene (PFNBr) and Sulfo-Polyfluorene (PFNSO).

The quantum dot light emitting device 100 further includes a substrate 20. The substrate 20 may be a transparent glass substrate or a transparent plastic substrate. The anode 110, the hole injection layer 120, the first hole transport layer 130, the first quantum dot light emitting layer 140, the charge generation layer 150, the second quantum dot light emitting layer 160, the first electron transport layer 170, the electron injection layer 180 and cathode 190 are disposed on a same side of the substrate 20, and the anode 110 is in contact with a surface of the substrate 20.

The hole injection layer 120 may be a poly((3,4-ethylenedioxythiophene)-poly(styrenesulfonate), i.e., PEDOT: PSS. A thickness of the hole injection layer 120 can be 40 nm.

The first hole transport layer 130 includes an organic hole transport material, the hole transport organic material is a P type organic material, and the P type organic material may be PVK, TFB or Poly-TPD and so on. A thickness of the first transport layer 130 may be 30~40 nm.

A thickness of the first quantum dot light emitting layer 140 is 30~40 nm. The first quantum dot light emitting layer 140 includes a single layer or multiple layers of quantum dots.

The charge generation layer 150 is configured for connecting the first quantum dot light emitting layer 140 with the second quantum dot light emitting layer 160 in tandem. A material of the second transport layer 151 may be a PEN layer, and a thickness of the second transport layer 151 is 10~20 nm.

The carrier generation layer 152 may be a metal layer such as aluminum. Preferably, a thickness of the carrier generation is 5 nm.

The second hole transport layer 153 includes a P-type metal oxide, and the P-type metal oxide includes any one or more than one of MoO3, NiO, V2O5 and WoO3. Preferably, a thickness of the second hole transport layer 153 is 10 nm.

A thickness of the second quantum dot light emitting layer 160 is 30~40 nm. The second quantum dot light emitting layer 160 includes a single layer or multiple layers of quantum dots.

The cathode 190 may be a metal, and the metal includes aluminum.

Compared with the prior art, the quantum dot light emitting device 100 of the invention includes the charge generation layer 150, and the charge generation layer 150 connects the first quantum dot light emitting layer 140 with the second quantum dot light emitting layer 160 in tandem. Moreover, the charge generation layer 150 includes the second electron transport layer 151, the carrier generation layer 152 and the second hole transport layer 153; and the second electron transport layer 151 includes a water/alcohol-soluble polymer. The water/alcohol-soluble polymer may be dissolved into a highly polar solvent such as water or methanal and so on. The damage applied onto the first quantum dot light emitting layer 140 during the second electron transport layer 151 is formed as a film can be avoided, and therefore the performance of the quantum dot light emitting device can be improved. Furthermore, the water/alcohol-soluble polymer is non-toxic and thus has no pollution to the environment and is green environmental protection during the production process.

Figure 2:
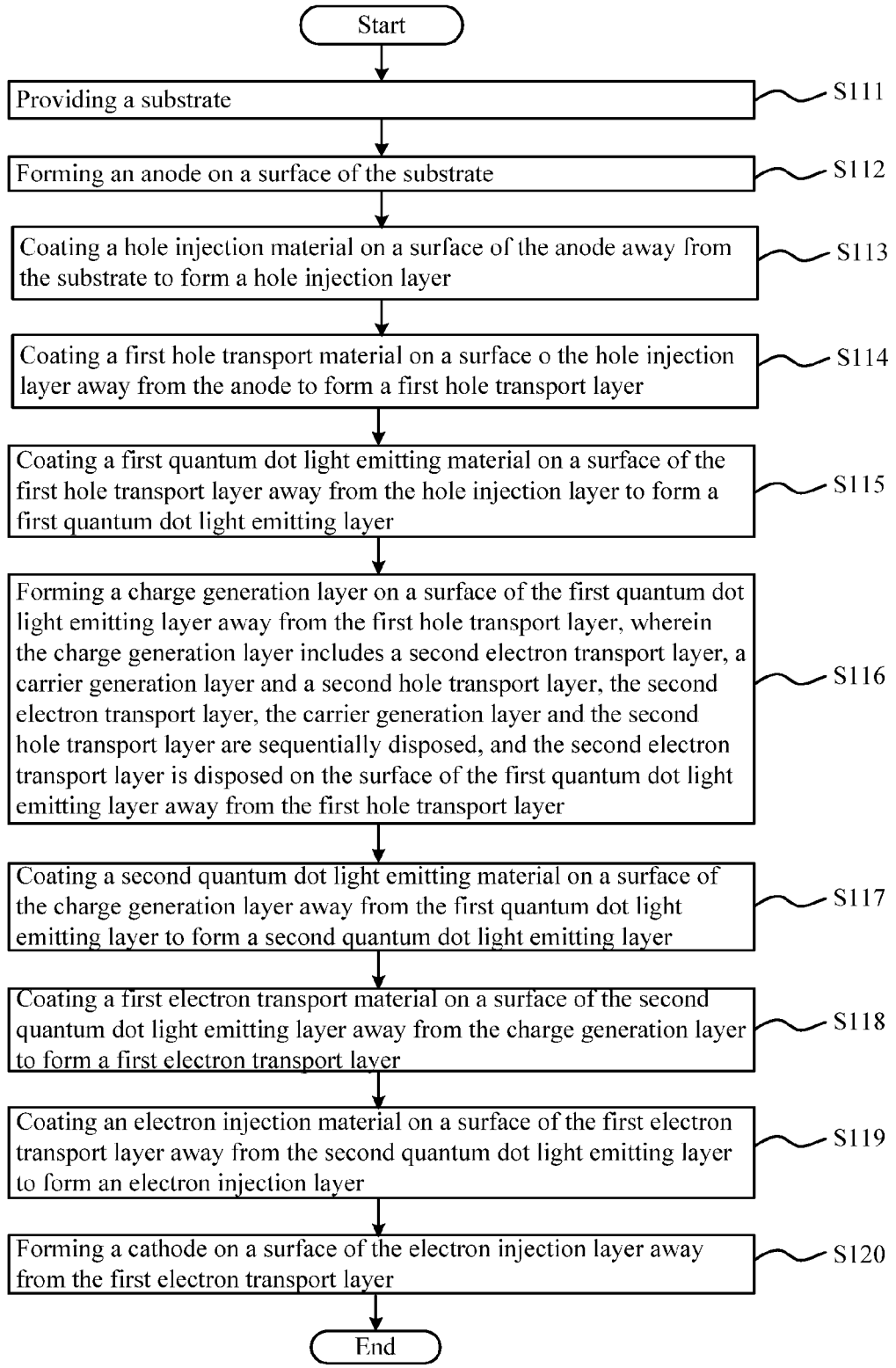
FIG. 2 is a flowchart of a manufacturing method of a quantum dot light emitting device according to a preferred embodiment of the invention.

In conjunction with FIG. 1 and the foregoing description of the quantum dot light emitting device, a manufacturing method of a quantum dot light emitting device of the invention will be described below. Please also refer to FIG. 2, FIG. 2 is a flowchart of a manufacturing method of a quantum dot light emitting device according to a preferred embodiment of the invention. The manufacturing method of a quantum dot light emitting device includes but is not limited to the following steps.

Step S111, providing a substrate 20.

Step S112, forming an anode 110 on a surface of the substrate 20.

Step S113, coating a hole injection material on a surface of the anode 110 away from the substrate 20 to form a hole injection layer 120.

Step S114, coating a first hole transport material on a surface of the hole injection layer 120 away from the anode 110 to form a first hole transport layer 130.

Step S115, coating a first quantum dot light emitting material on a surface of the first hole transport layer 130 away from the hole injection layer 120 to form a first quantum dot light emitting layer 140.

Step S116, forming a charge generation layer 150 on a surface of the first quantum dot light emitting layer 140 away from the first hole transport layer 130. The charge generation layer 150 includes a second electron transport layer 151, a carrier generation layer 152 and a second hole transport layer 153 sequentially stacked in that order, and the second electron transport layer 151 is disposed on the surface of the first quantum dot light emitting layer 140 away from the first hole transport layer 153.

Step S117, coating a second quantum dot light emitting material on a surface of the charge generation layer 150 away from the first quantum dot light emitting layer 140 to form a second quantum dot light emitting layer 160.

Step S118, coating a first electron transport material on a surface of the second quantum dot light emitting layer 160 away from the charge generation layer 150 to form a first electron transport layer 170.

Step S119, coating an electron injection material on a surface of the first electron transport layer 170 away from the second quantum dot light emitting layer 160 to form an electron injection layer 180.

Step S120, forming a cathode 190 on a surface of the electron injection layer 180 away from the first electron transport layer 170.

Specifically, one or multiple of the hole injection layer 120, the first hole transport layer 130, the first quantum dot light emitting layer 140, the second electron transport layer 151, the second hole transport layer 153, the second quantum dot light emitting layer 160, the first electron transport layer 170, the electron injection layer 180 may be formed by spin coating or spraying. For example, the hole injection layer 120 may be formed by spin coating or spraying, and more specifically, the hole injection material is spin coated or sprayed on the surface of the anode 110 away from substrate 20 to form the hole injection layer 120. When the first hole transport layer 130, the first quantum dot light emitting layer 140, the second electron transport layer 151, the second hole transport layer 153, the second quantum dot light emitting layer 160, the first electron transport layer 170 and the electron injection layer 180 also are formed by spin coating or spraying, their formation process can refer to that of the hole injection layer 120, and thus will not be repeated herein.

The carrier generation layer 152 and the cathode 190 may be formed by evaporation. Specifically, when the carrier generation layer 152 is formed by evaporation, a metal material is evaporated on the surface of the second electron transport layer 151 away from the first quantum dot light emitting layer 140 to form the carrier generation layer 152. When the cathode 190 is formed by evaporation, a metal material is evaporated on the surface of the electron injection layer 180 away from the first electron transport layer 170 to form the cathode 190.

Figure 3:
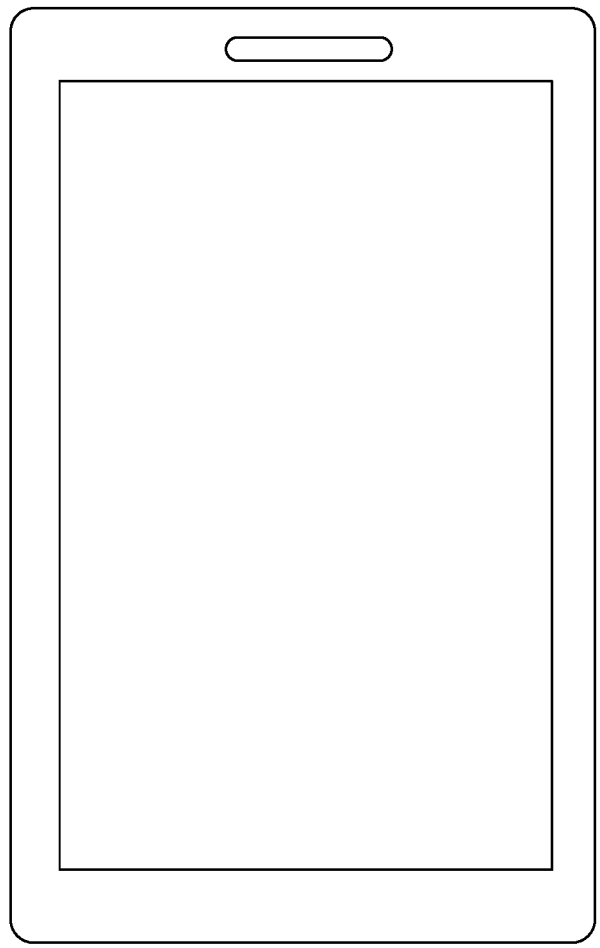
FIG. 3 is a structural schematic view of a liquid crystal display device according to a preferred embodiment of the invention.

The invention further provides a liquid crystal display device 10. Please refer to FIG. 3, the liquid crystal display device 10 includes the quantum dot light emitting device 100 as described above and thus will not be repeated herein. The liquid crystal display device 10 may include but is not limited to a portable electronic device such as a smart mobile, a mobile internet device (MID), an e-book, a portable play station or a personal digital assistant (PDP), it also may be a liquid crystal display monitor and so on.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A quantum dot light emitting device, wherein the quantum dot light emitting device comprises an anode, a hole injection layer, a first hole transport layer, a first quantum dot light emitting layer, a charge generation layer, a second quantum dot light emitting layer, a first electron transport layer, an electron injection layer and a cathode; the anode and the cathode are disposed opposite to and spaced from each other; the hole injection layer, the first hole transport layer, the first quantum dot light emitting layer, the charge generation layer, the second quantum dot light emitting layer, the first electron transport layer and the electron injection layer are sequentially stacked between the anode and the cathode in that order, the hole injection layer is contacted with the anode, and the electron injection layer is contacted with the cathode; the charge generation layer comprises a second electron transport layer, a carrier generation layer and a second hole transport layer; the second electron transport layer, the carrier generation layer and the second hole transport layer are sequentially stacked in that order, the second electron transport layer is disposed on a surface of the first quantum dot light emitting layer away from the first hole transport layer, and the second hole transport layer is disposed on a surface of the second quantum dot light emitting layer away from the first electron transport layer; the anode is configured for providing a first hole, the cathode is configured for providing a first electron, the hole injection layer is configured for injecting the first hole into the first hole transport layer, the first hole transport layer is configured for transporting the first hole to the first quantum dot light emitting layer, the electron injection layer is configured for injecting the first electron into the first electron transport layer, the first electron transport layer is configured for transporting the first electron to the second quantum dot light emitting layer, the carrier generation layer is configured for generating a second electron and a second hole, the second electron transport layer is configured for transporting the second electron to the first quantum dot light emitting layer, the second hole transport layer is configured for transporting the second hole to the second quantum dot light emitting layer, the second electron and the first hole are configured to be recombined in the first quantum dot light emitting layer to emit a first light, the second hole and the first electron are configured to be recombined in the second quantum dot light emitting layer to emit a second light, and the second electron transport layer comprises a water/alcohol-soluble polymer.

2. The quantum dot light emitting device as claimed in claim 1, wherein the water/alcohol-soluble polymer comprises any one or more than one of Polyfluorene (PFN), Polyfluorene Bromide (PFNBr) and Polyfluorene Sulfoxide (PFNSO).

3. The quantum dot light emitting device as claimed in claim 1, wherein the carrier generation layer is a metal layer.

4. The quantum dot light emitting device as claimed in claim 1, wherein the second hole transport layer comprises a P-type metal oxide, and the P-type metal oxide comprises any one or more than one of $MoO_3$, $NiO$, $V_2O_5$ and $WoO_3$.

5. The quantum dot light emitting device as claimed in claim 1, wherein a color of the first light is the same as that of the second light, or the color of the first light is different from that of the second light.

6. The quantum dot light emitting device as claimed in claim 1, wherein the anode comprises indium tin oxide, and the cathode comprises aluminum.

7. The quantum dot light emitting device as claimed in claim 1, wherein the first quantum dot light emitting layer comprises a single layer or multiple layers of quantum dots, or/and the second quantum dot light emitting layer includes a single layer or multiple layers of quantum dots.

8. The quantum dot light emitting device as claimed in claim 1, wherein a thickness of the second transport layer is 10~20 nm, a thickness of the carrier generation layer is 5 nm, and a thickness of the second hole transport layer is 10 nm.

9. A manufacturing method of a quantum dot light emitting device, wherein the manufacturing method of a quantum dot light emitting device comprises:
   providing a substrate;
   forming an anode on a surface of the substrate;
   coating a hole injection material on a surface of the anode away from the substrate to form a hole injection layer;
   coating a first hole transport material on a surface of the hole injection layer away from the anode to form a first hole transport layer;
   coating a first quantum dot light emitting material on a surface of the first hole transport layer away from the hole injection layer to form a first quantum dot light emitting layer;
   forming a charge generation layer on a surface of the first quantum dot light emitting layer away from the first hole transport layer, wherein the charge generation layer comprises a second electron transport layer, a carrier generation layer and a second hole transport layer, the second electron transport layer, the carrier generation layer and the second hole transport layer are sequentially stacked in that order, and the second electron transport layer is disposed on the surface of the first quantum dot light emitting layer away from the first hole transport layer;
   coating a second quantum dot light emitting material on a surface of the charge generation layer away from the first quantum dot light emitting layer to form a second quantum dot light emitting layer;
   coating a first electron transport material on a surface of the second quantum dot light emitting layer away from the charge generation layer to form a first electron transport layer;

coating an electron injection material on a surface of the first electron transport layer away from the second quantum dot light emitting layer to form an electron injection layer;

forming a cathode on a surface of the electron injection layer away from the first electron transport layer.

10. A liquid crystal display device, wherein the liquid crystal display device comprises a quantum dot light emitting device, the quantum dot light emitting device comprises an anode, a hole injection layer, a first hole transport layer, a first quantum dot light emitting layer, a charge generation layer, a second quantum dot light emitting layer, a first electron transport layer, an electron injection layer and a cathode; the anode and the cathode are disposed opposite to and spaced from each other; the hole injection layer, the first hole transport layer, the first quantum dot light emitting layer, the charge generation layer, the second quantum dot light emitting layer, the first electron transport layer and the electron injection layer are sequentially stacked between the anode and the cathode in that order, the hole injection layer is in contact with the anode, and the electron injection layer is in contact with the cathode; the charge generation layer comprises a second electron transport layer, a carrier generation layer and a second hole transport layer, the second electron transport layer, the carrier generation layer and the second hole transport layer are sequentially stacked in that order, the second electron transport layer is disposed on a surface of the first quantum dot light emitting layer away from the first hole transport layer, and the second hole transport layer is disposed on a surface of the second quantum dot light emitting layer away from the first electron transport layer; the anode is configured for providing a first hole, the cathode is configured for providing a first electron, the hole injection layer is configured for injecting the first hole into the first hole transport layer, the first hole transport layer is configured for transporting the first hole to the first quantum dot light emitting layer, the electron injection layer is configured for injecting the first electron into the first electron transport layer, the first electron transport layer is configured for transporting the first electron to the second quantum dot light emitting layer, the carrier generation layer is configured for generating a second electron and a second hole, the second electron transport layer is configured for transporting the second electron to the first quantum dot light emitting layer, the second hole transport layer is configured for transporting the second hole to the second quantum dot light emitting layer, the second electron and the first hole are configured to be recombined in the first quantum dot light emitting layer to emit a first light, the second hole and the first electron are configured to be recombined in the second quantum dot light emitting layer to emit a second light, and the second electron transport layer comprises a water/alcohol-soluble polymer.

11. The liquid crystal display device as claimed in claim 10, wherein the water/alcohol-soluble polymer comprises any one or more than one of Polyfluorene (PFN), Polyfluorene Bromide (PFNBr) and Polyfluorene Sulfoxide (PFNSO).

12. The liquid crystal display device as claimed in claim 10, wherein the carrier generation layer is a metal layer.

13. The liquid crystal display device as claimed in claim 10, wherein the second hole transport layer comprises a P-type metal oxide, and the P-type metal oxide comprises any one or more than one of $MoO_3$, $NiO$, $V_2O_5$ and $WoO_3$.

14. The liquid crystal display device as claimed in claim 10, wherein a color of the first light is the same as that of the second light, or the color of the first light is different from that of the second light.

15. The liquid crystal display device as claimed in claim 10, wherein the anode comprises indium tin oxide, and the cathode comprises aluminum.

16. The liquid crystal display device as claimed in claim 10, wherein the first quantum dot light emitting layer comprises a single layer or multiple layers of quantum dots, or/and the second quantum dot light emitting layer comprises a single layer or multiple layers of quantum dots.

17. The liquid crystal display device as claimed in claim 10, wherein a thickness of the second electron transport layer is 10~20 nm, a thickness of the carrier generation layer is 5 nm, and a thickness of the second hole transport layer is 10 nm.

\* \* \* \* \*